(12) United States Patent
Sorg et al.

(10) Patent No.: US 11,789,347 B2
(45) Date of Patent: Oct. 17, 2023

(54) LASER PROJECTION ARRANGEMENT AND METHOD FOR ARRANGING THEREOF

(71) Applicant: OSRAM Opto Semiconductors GmbH, Regensburg (DE)

(72) Inventors: Jörg Erich Sorg, Regensburg (DE); Nicole Berner, Walderbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 226 days.

(21) Appl. No.: 17/129,979

(22) Filed: Dec. 22, 2020

(65) Prior Publication Data
US 2022/0197123 A1   Jun. 23, 2022

(51) Int. Cl.
*G03B 21/20*   (2006.01)
*H01S 5/40*   (2006.01)
*H01S 5/0237*   (2021.01)
*H01S 5/0233*   (2021.01)
*H01S 5/22*   (2006.01)
*F21V 8/00*   (2006.01)

(52) U.S. Cl.
CPC ......... *G03B 21/2033* (2013.01); *G02B 6/002* (2013.01); *H01S 5/0233* (2021.01); *H01S 5/0237* (2021.01); *H01S 5/22* (2013.01); *H01S 5/4031* (2013.01)

(58) Field of Classification Search
CPC ... G02B 6/002; G03B 21/2033; H01S 5/0234; H01S 5/0237; H01S 5/22; H01S 5/4031
See application file for complete search history.

(56) References Cited

U.S. PATENT DOCUMENTS

| | | | |
|---|---|---|---|
| 11,183,492 B2 * | 11/2021 | Krasulick | H01L 21/76254 |
| 2004/0022491 A1 * | 2/2004 | Tella | G02B 6/4238 385/39 |
| 2010/0215072 A1 * | 8/2010 | Funabashi | G02B 6/42 257/E31.127 |
| 2019/0067900 A1 * | 2/2019 | Bhattacharya | H01L 31/03048 |
| 2021/0215875 A1 * | 7/2021 | Koch | G02B 6/107 |

FOREIGN PATENT DOCUMENTS

CN   108242763 A * 7/2018 ........... H01S 5/0425

* cited by examiner

*Primary Examiner* — Thomas A Hollweg
*Assistant Examiner* — Mary A El-Shammaa
(74) *Attorney, Agent, or Firm* — MH2 TECHNOLOGY LAW GROUP LLP

(57) ABSTRACT

The invention relates to a laser projection arrangement. The arrangement includes a sub-mount carrier with a main surface and at least one edge-emitting laser arranged on the sub-mount. The at least one edge-emitting laser is facing the sub-mount and includes at least one laser facet that is located at a predefined distance from the main surface of the sub-mount. A planar light circuit with at least one light guide has an inlet and is arranged on the sub-mount such that the at least one light guide and the inlet is located at the predefined distance from the main surface of the sub-mount facing the at least one laser facet.

18 Claims, 5 Drawing Sheets

LASER PROJECTION ARRANGEMENT AND METHOD FOR ARRANGING THEREOF

The present invention relates to a laser projection arrangement and to a method for arranging a laser projection arrangement.

Current projection systems require red, green and blue light sources to obtain light for projecting a picture, a symbol and the like. While light emitting diodes may be used to provide the light sources, recently, laser sources are becoming more preferred due to their various advantages over conventional light sources. These laser based projection systems are also referred to as "Laser Beam Scanning" (LBS). Those systems utilize laser emitting light of red green and blue colour superimposing the emitted light to a combined ray.

For superimposing the beam several different concepts are available including for example dichroitic beam combiner and subsequent lenses arrangements for beam collimations. However, the various solutions require individual components, which may be expensive to obtain and maintain. Further manufacturing and particularly calibration or adjustment of the component is time consuming further increasing the overall costs.

Hence, there is a need for reduces overall costs.

SUMMARY OF THE INVENTIONS

The present disclosure provides a laser projection arrangement and a method for arranging a laser projection arrangement. The present disclosure proposes a compact and cost-reduced solution of a laser projection arrangement. In some instances, the present disclosure proposes a solution to combined laser emitted light in a cost efficient and compact manner.

In an aspect, a laser projection arrangement comprises a sub-mount carrier with a main surface and at least one edge-emitting laser arranged on the main surface. The at least one edge-emitting laser is facing the sub-mount and comprises at least one laser facet that is located at a predefined distance from the main surface. A planar light circuit with at least one light guide comprises an inlet, wherein the planar light circuit is arranged on the main surface such that the at least one light guide and the inlet is facing the at least one laser facet and the inlet is located at the predefined distance from the main surface of the sub-mount.

The PLC elements are preferably configured so that they move the wavefronts of a light signal caused by the length and curvature relative to each other. This contributes to suppressing interference effects that again are one of the main causes of optical artefacts in imaging systems.

A typical application for AR/VR glasses concepts use diffractive light guide in the lenses of the glasses. Diffractive light guides (light distribution via diffraction effects) in connection with coherent light sources might be susceptible to optical artefacts, which can be avoided by the use of planar light circuits. Providing the edge-emitting laser and the planar light circuit on a defined same height reduces the overall complexity for adjustment. Adjusting both elements may become easier, as adjustment in one dimension is not required any longer. In an aspect, a spacer may be located between the at least one edge-emitting laser and the at least one light guide. The spacer can be part of a metallisation layer forming the main surface. Alternatively, the spacer can be arranged on the surface of the planar light circuit facing the at least one edge-emitting laser or the surface of the at least one edge-emitting laser facing the planar light circuit.

In one aspect, a single mode laser may be utilized as edge-emitting laser having a facet area in the range of 200 $nm^2$ to 2 $\mu m^2$, in particular 800 $nm^2$ to 1.2 $\mu m^2$. A distance between the laser facet and the inlet of the at least one light guide may be in the range of several 100 nm to a few µm.

In another aspect, the planar light circuit comprises a carrier, on which the at least one light guide is arranged on. The carrier may comprise glass, silicon, sapphire or any other suitable material. In some aspects, the at least one light guide may be embedded in the glass carrier. Embedding a light guide into a carrier can be achieved by ion implanting or other method causing a change in the refractive index.

In some instances, the main surface of the sub-mount comprises a first metallized contact layer. The contact layer is flat and comprises only a very small surface roughness. In particular, the metallisation layer provides a defined smooth surface, to which all other elements of the arrangement can be placed upon. The at least one edge-emitting laser is arranged on the metallisation layer and adhered thereto thereby defining the distance from the main surface of the sub-mount. In some aspects, the at least one edge-emitting laser comprises a first surface part facing the sub-mount, which is directly in contact with the metallized contact layer and a second surface part facing the sub-mount, which is adhered to, in particular soldered to the sub-mount. Alternatively, the laser may be spaced apart from the metallisation layer by predefined and well-known distances and for examples soldered to the metallisation layer.

In some instances, a common metallisation layer may be utilized, on which the planar light circuit and the at least one edge-emitting laser is arranged upon. Both elements can be soldered, glued or otherwise fixated to the metallisation layer, such that the inlet of the light guide and laser facet are facing each other and are particularly on the same height. In some aspects, the at least one edge-emitting laser comprises a ridged resonator, wherein the ridged resonator is surrounded along the sides with a passivation layer and covered with a metallisation, the metallisation facing the sub-mount. In some further aspects the at least one edge-emitting laser comprises two or more ridged resonators substantially parallel to each other. The two or more ridged resonators can be spaced apart by a distance in the range of 10 µm to 100 µm, in particular, in the range of 50 µm. such embodiment provides a laser with several laser facets configured to emit laser light in operation. Consequently, the planar light circuit may comprises two light guides, the inlets of those spaced apart by the same distance and facing the laser facets.

Another aspect concerns the adjustment not in z-direction as this direction is defined by the distance of the centre of the laser facet from the main surface or any other reference level, but in the x- and y-directions. In some aspects, a spacer is arranged between the at least one edge-emitting laser and the at least one light guide. The length or size of the spacer can therefore define the distance between the inlet and the laser facet, referred to as the distance in y-direction. Adjusting both element in y-direction can be achieved by moving the elements towards each other until the spacer is in contact with both element. The spacer can be part of the edge-emitting laser, the planar light circuit, the sub-mount or a combination thereof and for example configured as a protrusion and the like.

Another aspect is the adjustment in x-direction. In some aspects, the laser projection arrangement may comprise at least one fiducial arranged on the at least one edge-emitting laser. Another at least one fiducial is arranged on the planar light circuit. The respective fiducials are arranged in a defined relation to the laser facet and the inlet and configured for adjusting the inlet of the at least one light guide and the at least one laser facet. In some aspects, the at least two fiducials are substantially arranged in the same plane, said plane parallel to the main surface of the sub-mount. This will allow an automated adjustment using cameras, which can focus on both fiducials. More fiducials can be arranged on the laser and the planar light circuit when needed. The fiducials can be implemented as signs or markings or simply drawn on the surface.

In some aspects, the material of the at least one light guide comprises $Si_3N_4$ and the at least one light guide is covered from at least one side by a metallisation layer. In some other aspects, the light guide may comprise an ion doped glass or other material having a different refractive index than the surrounding body.

A further aspect relates to an arrangement with several edge-emitting laser. One embodiment concerns a laser projection arrangement comprising at least three edge-emitting laser configured to emit light of different wavelengths, wherein the at least three edge-emitting lasers are arranged on the sub-mount and each of the three edge-emitting laser comprises at least one laser facet. The planar light circuit comprises at least three light guides having an inlet, wherein a respective inlet is facing one of the at least one laser facets. Furthermore, the planar light circuit is configured to combine light of the at least three light guides and provide the combined light at a common outlet. This configuration allows to generate one or more single white (or any other colour) light dots. In combination with additional laser facets per edge-emitting laser, one can also change intensity over a wide range.

In some aspects, a common metallisation layer is provided on the sub-mount comprises to provide a planar surface. The at least three edge-emitting laser are attached on the metallisation thereby defining the distance from the main surface of the sub-mount. In addition, the metallisation may also be used as planar surface for the planar light circuit. The common metallisation layer can be smoothened such the layer comprises an equal height. In another aspect, the sub-mount also comprises one or more second contact layers on the sub-mount configured to provide an electrical contact to one of the at least one edge-emitting laser, in particular to provide an area for bond contact to connect to the at least one edge-emitting laser.

Some further aspect concern a method for arranging a laser projection arrangement. In a first step, a sub-mount with a main surface is provided, configured to receive at least one edge-emitting laser and at least one planar light circuit. The at least one edge-emitting laser is arranged onto the sub-mount such that the at least one edge-emitting laser is facing the main surface. Likewise at least one laser facet of the at least one edge-emitting laser is located at a pre-defined distance from the main surface. In a further step, a planar light circuit with at least one light guide having an inlet is provided. The planar light circuit is configured to move the wave fronts of the light signal using different length and curvature relative to each other, thereby configured to suppress interference of the emitted laser signal. The planar light circuit is arranged with the at least one light guide facing the main surface such that the inlet of the at least one edge emitting laser is positioned at the pre-defined distance from the main surface and facing the at least one edge-emitting laser.

For fixating the at least one edge-emitting laser and the planar light circuit several approaches are possible. In one aspect, the at least one edge-emitting laser is soldered, glued, friction weld or otherwise mechanically fixated onto the sub-mount. Likewise, the planar light circuit onto the sub-mount may be soldered, glued, friction weld or otherwise mechanically fixated onto the sub-mount. In some instances, the edge-emitting laser may be arranged on the sub-mount such that portions of it, for example its ridge is in direct contact with the metallisation of the sub-mount. The edge-emitting laser may then be soldered on its edges to the sub-mount.

For providing a planar and smooth surface, a structured planarized metallisation layer is deposited onto the sub-mount.

SHORT DESCRIPTION OF THE DRAWINGS

Further aspects and embodiments in accordance with the proposed principle will become apparent in relation to the various embodiments and examples described in detail in connection with the accompanying drawings in which FIG. 1 shows a side view of a laser projection arrangement in accordance with some aspects of the present disclosure;

DETAILED DESCRIPTION

The following embodiments and examples disclose different aspects and their combinations according to the proposed principle. The embodiments and examples are not always to scale. Likewise, different elements can be displayed enlarged or reduced in size to emphasize individual aspects. It goes without saying that the individual aspects of the embodiments and examples shown in the figures can be combined with each other without further ado, without this contradicting the principle according to the invention. Some aspects show a regular structure or form. It should be noted that in practice slight differences and deviations from the ideal form may occur without, however, contradicting the inventive idea.

In addition, the individual figures and aspects are not necessarily shown in the correct size, nor do the proportions between individual elements have to be essentially correct.

Some aspects are highlighted by showing them enlarged. However, terms such as "above", "over" "below", "under" "larger", "smaller" and the like are correctly represented with regard to the elements in the figures. So it is possible to deduce such relations between the elements based on the figures.

Figure 1:
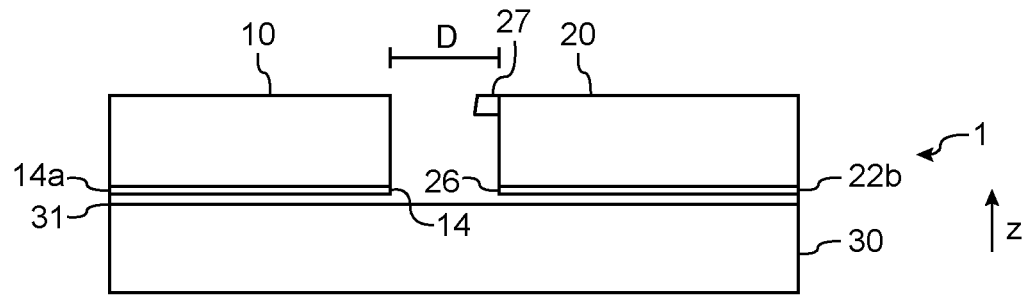

FIG. 1 illustrates a side view of a laser projection arrangement in accordance with some aspects of the present disclosure.

The laser projection arrangement comprises a sub-mount carrier having a metallized and planar surface 31. At least one edge-emitting laser 10 is arranged on the surface of the sub-mount carrier 30. The at least one edge-emitting laser is facing the surface of sub-mount carrier 30 and comprises one or more laser ridges 14a, acting as ridge resonators. A laser facet 14 at one end of the edge-emitting laser is used to out couple laser light generated in the ridge resonator. The centre of the laser facet 14 is located at a predefined distance from the main surface of the sub-mount carrier 30.

In accordance with the proposed principle, a planar light circuit 20, also referred to as PLC, with at least one light guide 22 having an inlet 26 is located adjacent to and facing the laser facet of the edge-emitting laser 10. Similar to the edge-emitting laser, the at least one light guide 22 is facing the main surface of the sub-mount carrier 30 and metallization layer 31. The inlet 26 is arranged opposite the laser facet and, in particular, located at the same predefined distance from the main surface of sub-mount carrier 30. Using the arrangement shown in FIG. 1 and in particular arranging the laser facet 14 as well as the inlet 26 at the same predefined distance from the main surface of the sub-mount carrier, the in-coupling of laser light coming from other edge-emitting laser 10 into the light guide of the PLC 20 can be significantly improved. The PLC with the light guide is configured to process light in a certain way and out-couple the light at its output 22.

In this regard, it is stated that laser facet 14 and inlet 26 of light guide 20 are on equally distanced to the main surface, meaning their respective centre comprise the same distance to the surface. It is understood and considered equivalent for the purpose of the disclosed principles, that the surface can be replaced with any other defined reference level, to which the distance is associated. Using the distance to the surface on which both elements, laser 10 and PLC 20 are attached offers a simple solution, but any other reference level can be used as well, as long as the vector to said reference level comprises a component in z-direction.

Figure 2:
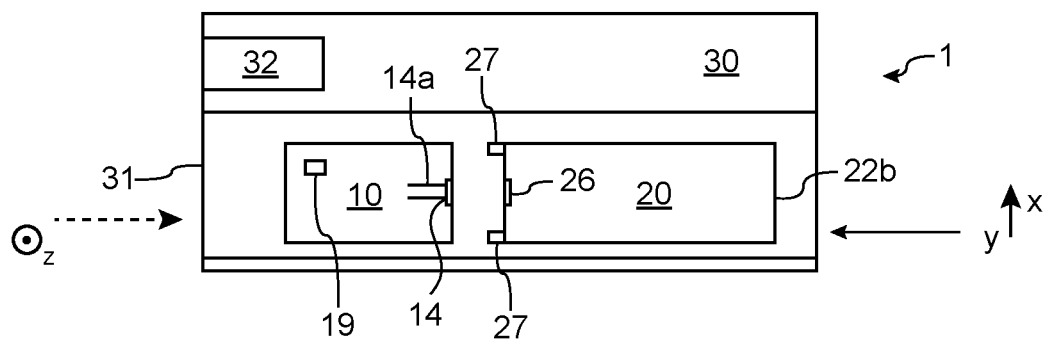
FIG. 2 illustrates the laser projection arrangement of FIG. 1 in top view.

FIG. 2 illustrates the top view of the proposed laser arrangement of FIG. 1. As shown, the planar sub-mount carrier comprises an area larger than the actual area on which the laser 10 as well as the PLC 20 is arranged. For example, the planar sub-mount carrier 30 may comprise two metallisation layers 31 and 32. The first metallisation layer 31 is a planar metallisation layer comprising the same thickness and level across the whole area of sub-mount carrier 30. Metallisation layer 31 may also act as an electrical contact for the laser arrangement and particular for the edge-emitting laser 10. On top of the edge-emitting laser 10 second contact area 19 is arranged, which is bonded to the second planar metallisation layer 32.

The first metallisation layer 31 acts as a support for both, the edge-emitting laser 10 and the planar light circuit 20. Due to its flat plane, the height is well defined, thus allowing, as shown in FIG. 1, to position inlet 26 of the planar light circuit 20 directly opposite the laser facet 14 of ridge 14a. The orientation of the laser facet 14 and inlet 26 of light guide 22 in z-direction is precisely adjustable and can be set in advance by selecting proper design. As a result, laser facet 14 and inlet of the light guide 26 need to be positioned only in x- or y-direction, thus reducing the complexity of an adjustment process.

It is appreciated that metallisation layer provides a flat surface, such that orientation of the laser facet 14 and inlet 26 of light guide 22 in z-direction is aligned. However, the sub-mount carrier and/or the metallisation layer may comprise steps outside the area on which the edge-emitting laser 10 and the planar light circuit 20 is arranged. For example, sub-mount carrier and/or the metallisation layer may form one or more pedestals or raised bases on which laser 10 and PLC are arranged. For example, the laser 10 can be arranged on a raised base (i.e. provided by a metallization layer, while the PLC is arranged outside this base due to its design, but still maintaining the requirement that the laser facet is aligned opposite the inlet in z-direction (and x-, and y-directions, see below). In other words, the sub-mount carrier may comprise different metallic and non-metallic structures on which the PLC and the laser 10 can be arranged upon, whereas those structures are different in height, while maintaining the above mentioned alignment.

For further improvement of the in-coupling of laser light into a light guide 22, it is useful to arrange inlet 26 as close as possible to laser facet 14 without the risk of damaging the laser facet. This can be achieved by proper spacer 27, two of which are attached to the front side of PLC 20. The spacers 27 are implemented as protrusions on the surface of another light circuit 20 in the proximity of the outlet 26, providing a certain distance D to the main surface of inlet 26. The height of spacers 27 can be in the range of a few μm up to 10 to 50 μm, and should be sufficient to compensate for any thermal expansion or movement of both elements 10 and 20 during operation of the arrangement. For proper positioning of the arrangement, either edge-emitting laser 10 or PLC 20 is moved until spacers 27 touch the opposite surface.

In an alternative embodiment, spacers 27 can also be arranged on the laser 10 close to the laser facet or even arranged on the metallisation layer 31.

Figure 3:
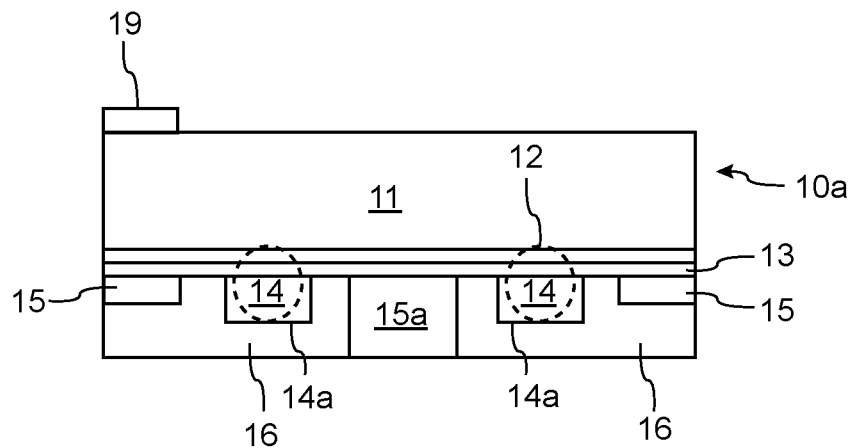
FIG. 3 shows a front view onto a laser facets of a laser with multiple ridges to illustrate some aspects of the present disclosure.

FIG. 3 illustrates an alternative arrangement of an edge-emitting laser 10 in accordance with some aspects of the present invention. In the present case, edge-emitting laser 10 comprises a multi-quantum well structure 12 arranged in between a first doped layer 13 and a second doped layer 11. Layer 11 may be n-doped, layer 13 may be p-doped, but the doping can also be reversed. More layers may also be part of the edge-emitting laser and the design of laser 10 is known to the skilled person.

Depending on the design choice of the respective laser electron-hole pairs are recombining in the multi-quantum well structure, and particularly in the vicinity of facets 14 and 14'. Facets 14 and 14' are part of an elongated ridge 14a into the drawing plane acting as a ridge resonator. Its length and both ends provide the resonator mirrors, whereas facets 14, 14' are used for out-coupling of laser light. The ridge 14a can be implemented also of un-doped or doped material, for example of material forming layer 13. The ridge 14a forms a confinement, causing the recombination of electron hole pairs, in particular in the quantum well areas above the respective ridges.

In between both ridges with facets 14 and 14', a passivation element 15a is arranged to separate both laser ridges from each other. The distance of both laser facets 14 and 14' may be in the range of about a hundred microns, but can be closer down to 50 μm or up to 500 μm. For connecting the p-doped area 13 and the respective laser ridges, a metallisation layer 16 is arranged adjacent to passivation element 15a. Further passivation layers 15 are located below doped layer 13 to ensure current injection in a certain area close the multi-quantum well structure above the ridges. For electrical contact, the n-doped layer 11 comprises on its main surface contact area 19. Contact area 19 connects to layer 11 and is configured such that a bond wire or another electrical connection is possible.

Figure 4:
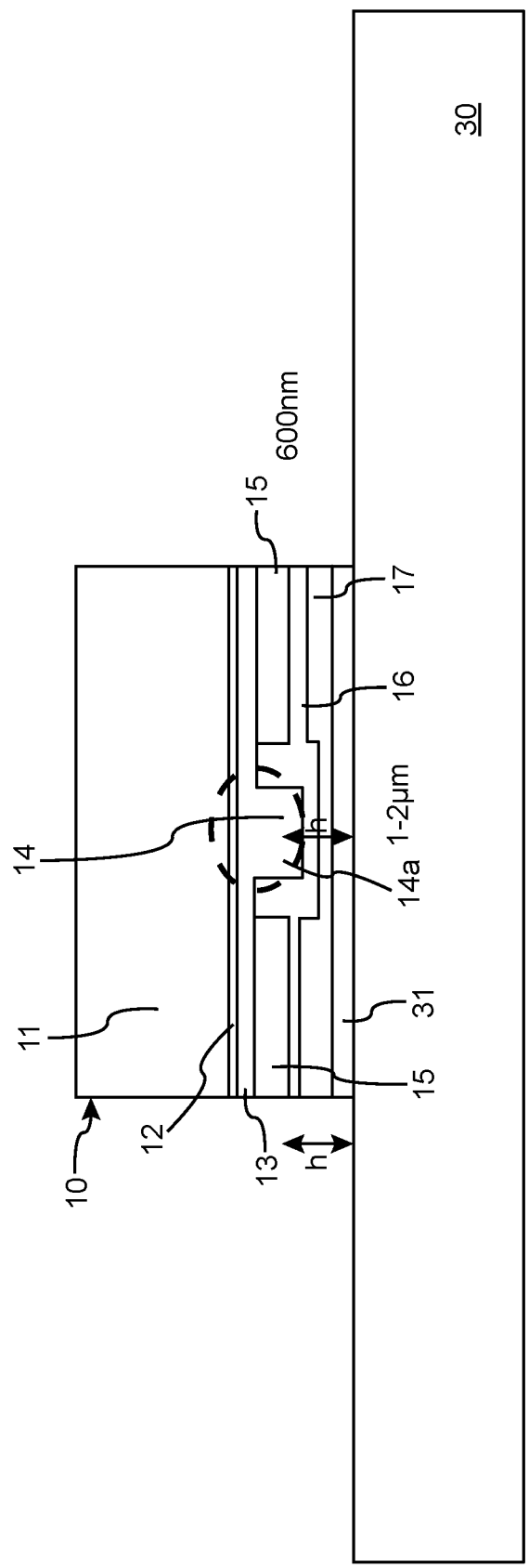
FIG. 4 illustrates a front view of a laser element of an exemplary embodiment arranged on a sub-mount in accordance with some aspects of the present disclosure.

FIG. 4 illustrates a front view onto laser facet 14 of an edge-emitting a laser arranged on a sub-mount carrier 30 in accordance with some aspect of the present disclosure. As outlined previously, edge-emitting laser 10 comprises a first doped layer 11, a multi-quantum well structure 12 and a second doped layer 13. Laser facet 14 corresponds to ridge area 14a and comprises the front mirror on which the laser light generated by the edge-emitting laser is coupled out of the element. Laser ridge 14a is surrounded by a metallisation layer 16, which on the one side provides an electrical contact to the doped layer 13 and on the other an optical barrier for the ridge resonator 14a. Adjacent to the metallisation 16 in the proximity of the laser ridge 14a, two passivation layers 15 are arranged on the doped layer 13. Consequently, a current injection via metallisation 16 is achieved closer to the laser ridge 14a, thus restricting the light generation to the vicinity illustrated by the dotted line herein.

Sub-mount carrier 30 comprises metallisation layer 31, which is located opposite of laser element 10. In this particular example, a solder material 17 is arranged between the metallisation layer 31 and metallisation layer 16, said metallisation layer 16 completely covering passivation layers 15 and resonator ridge 14a. The solder material 17 fills the space between the edge-emitting laser 10 and the metallisation layer 31 of carrier 30.

As a result, the distance between the laser facet 14 to the upper surface of metallisation layer 31 is given by the thickness of metallisation layer 16 on the bottom side of ridge element 14a and the thickness of the solder material 17 between the resonator 14a and metallisation layer 31. Said thickness can be defined precisely, thus allowing to position edge-emitting laser 10 at a predefined distance to the surface of carrier 30, metallisation layer 31 or any other reference level. In each case, the arrangement allows to position laser facet 14 at a precise and predefined height towards a specific and defined reference level.

Figure 5:
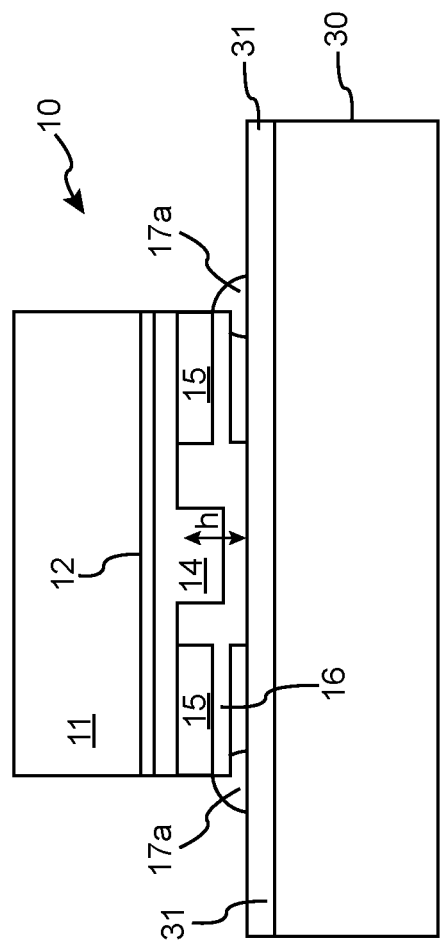
FIG. 5 shows a front view of a laser element of another exemplary embodiment arranged on a sub-mount in accordance with some aspects of the present disclosure.

FIG. 5 shows an alternative solution to obtain a laser projection arrangement, in which the position of a defined height can be further improved, that is, the position can be defined with less uncertainty. The laser projection arrangement comprises an edge-emitting laser 10, which is arranged and located on top metallisation layer 31 of the sub-mount carrier 30. In this example, edge-emitting laser 10 comprises a ridge resonator 14a having a facet 14, which is surrounded by metallisation layer 16. As illustrated, the ridge resonator surrounded by the metallisation layer extends slightly over the main surface of laser 10 and forms an elevated protrusion of the edge-emitting laser. That protrusion is substantially flat and is now positioned directly on top of metallisation layer 31 of sub-mount 30.

Because of this arrangement, spaces are formed below the metallisation layer 16 on top of passivation layer 15. Those spaces are located between the metallisation layer 31 and portions of the edge-emitting laser 10 adjacent to the protruded ridge 14a. The height h is now defined by the distance h between a centre of the ridge resonator 14a and the top surface of metallisation layer 31, the latter acting as reference level. As metallisation layer 16 and the ridge resonator 14a can be precisely manufactured, the distance h is well known.

Solder material 17a is now arranged along the edge of the body of laser 10 to provide further metallized contact and mechanical stability. As shown, a portion of the solder material flows, caused by a capillary effect, under the small space between the passivation layer 15 and the metallisation layer 31. The benefit of this structure lies in the precise control of the distance between the centre of the laser facet 14 and the surface of metallisation layer 31, which is given inter alia by design choice of the edge-emitting laser 10. In contrast to the previous embodiment, no solder material is located between the metallisation layer 31 and metallisation layer 16 below the ridge resonator, thus reducing the tolerance caused by the solder material.

Figure 6:
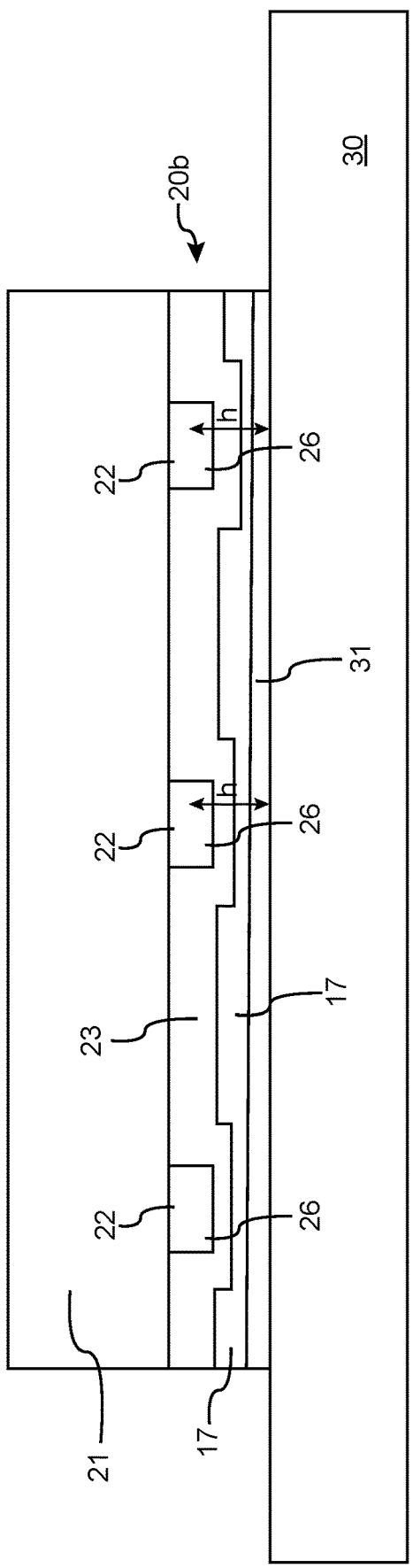
FIG. 6 illustrates a front view of planar light circuit of an exemplary embodiment arranged on a sub-mount in accordance with some aspects of the present disclosure.

FIG. 6 now illustrates a front view of a PLC 20b forming the laser projection arrangement. The planar light circuit PLC 20b comprises a glass or circuit body substrate 21 with a planar surface facing the sub-mount carrier 30 and metallisation layer 31. In the illustration, metallisation layer 31 has the same lateral dimensions as PLC 20b, but can also extend and cover the whole surface of sub-mount 30. The thickness of metallisation layer 31 corresponds to the metallisation layer 31 of FIGS. 4 and 5.

In accordance with the proposed principle, a plurality of light guides 22 are arranged on the lower surface of the circuit body 21 of PLC 20b. Each light guide comprises an inlet surface 26 facing the respective laser facet of the edge-emitting laser. A metallisation layer 23 surrounds each of the light guides and provides an additional optical confinement for light coupling into the light guides. The metallisation layer 23 extends not only between the respective light guides 22, but also on the lower surface of each light guide facing metallization layer 31. The thickness of layer 23 in said area below the light guide 22 corresponds to the thickness of the metallisation layer of the ridge resonator of the edge-emitting laser. Similar to the previous embodiment in FIG. 4, a solder material 17 is located between the lower surface of the PLC and the metallisation layer 31 mechanically fixating the PLC 20b to the carrier. The thickness of the metallisation below the light guides and the thickness of the solder material is adjusted in such way that the centre of the inlet 26 of each light guide faces the corresponding centre of the laser facet of a corresponding edge-emitting laser. A material for the light guides is $Si_3N_4$, whereas an optical confinement between the material of the light guide 22, circuit body 21 and metallization 23 is obtained. Any other suitable material offering a suitably different refractive index compared to the surrounding material can also be used.

In summary, the design of the edge-emitting laser and the PLC is adjusted to each other such that the respective centres comprise the same distance towards a reference level, most often a surface of the common sub-mount carrier. As a result, the distance h between the surface of the sub-mount 30 and a centre of the inlet 26 corresponds to the distance of the edge-emitting laser. This will allow a precise positioning in z-direction, enabling a more simplified positioning and adjustment procedure during manufacturing of the laser projection arrangement.

Figure 7:
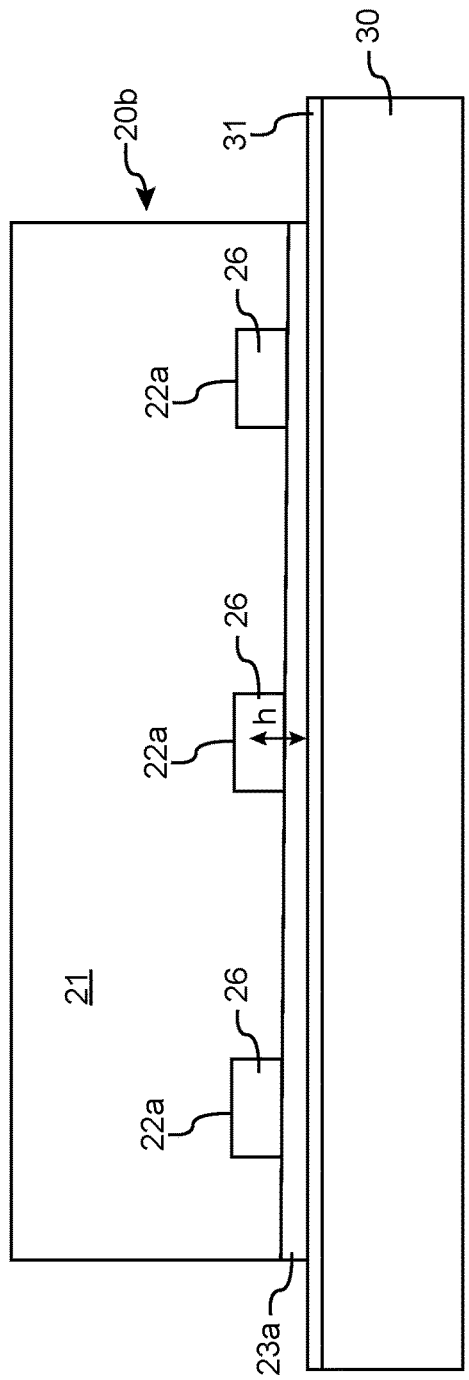
FIG. 7 illustrates a front view of planar light circuit of another exemplary embodiment arranged on a sub-mount in accordance with some aspects of the present disclosure.

FIG. 7 illustrates an alternative embodiment for a planar light circuit 20b in accordance with some aspects of the proposed principle.

The planar light circuit 20b comprises circuit body 21, whereas several light guides 22a are embedded within circuit body 21. Circuit body 21 and light guides 22a comprise different material with a diffractive index sufficiently different to enable confinement of light within light guide 22a. Metallisation layer 23a is arranged on a top of the light guides and the circuit body and provides a planar surface of defined dimensions. Layer 23a is mechanically fixed to metallisation layer 31 of the sub-mount carrier 30, for example by friction welding. The thickness of metallisation layer 23a is adjusted in such way, that it corresponds to the thickness of metallisation layer 16 below the ridge resonator in FIG. 5.

As a result, the centre of the inlet of each light guide is distanced to the upper surface of metallisation layer 31 (or any other common reference level) by a value, which corresponds to the distance between the centre of the laser facet 14 and top surface of metallisation layer 31 in the embodiment of FIG. 5. Similar to the previous solution, an adjustment for the facet of the edge-emitting laser and the inlet of PLC 20b can be simplified, as the laser facet and the inlet are located at the same height compared to a common reference level.

Figure 8:
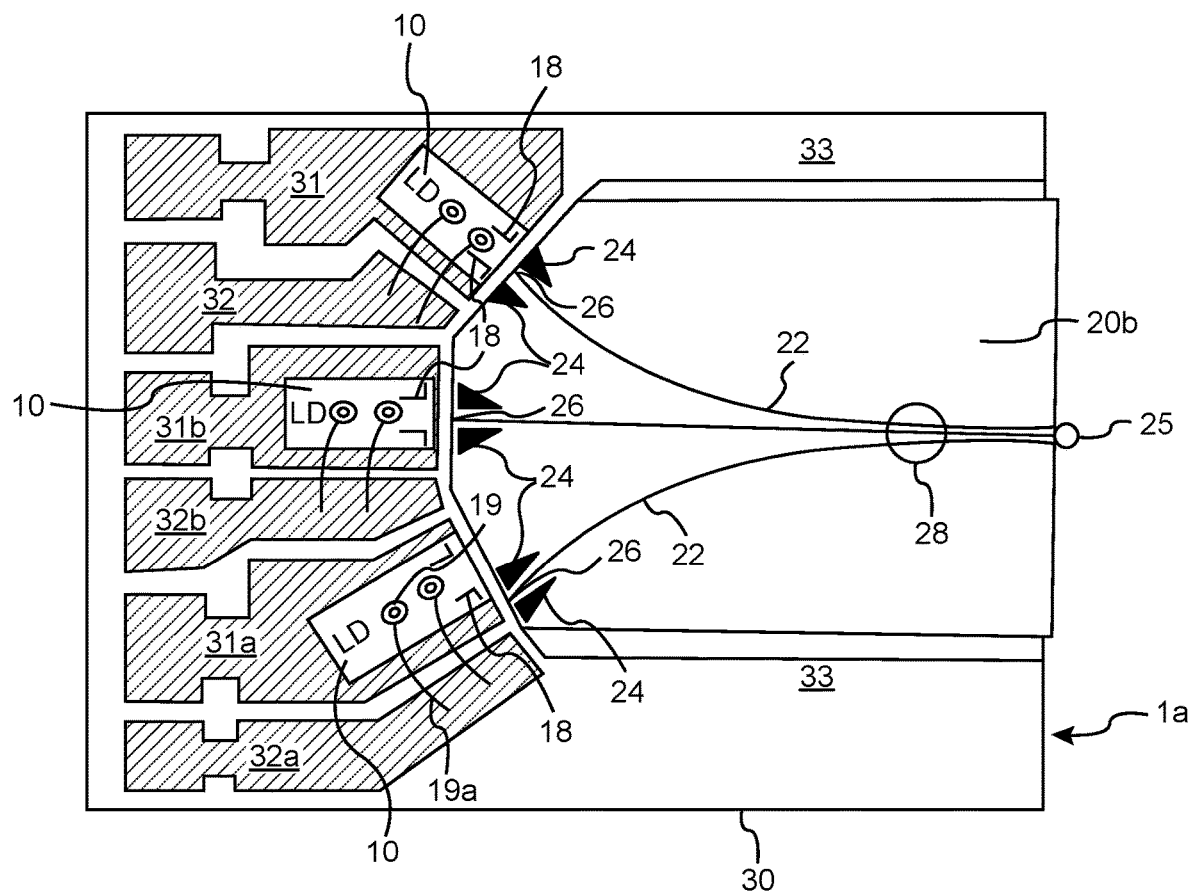
FIG. 8 shows a top view of an exemplary laser arrangement with three different laser in accordance with some aspects of the present disclosure.

For a further simplified procedure in positioning the edge laser in x- and y-direction, fiducials or other markers on the edge-emitting laser and the PLC are proposed. FIG. 8 illustrates an example of a laser projection arrangement suitable to provide white or coloured light in accordance with some aspects of the present invention.

Sub-mount carrier 30 of laser projection arrangement comprises a plurality of metallisation layers 31, 31a, 31b and 32, 32a, 32b. Each metallisation layer 31, 31a and 31b as well as 32, 32a and 32b comprises a planar surface with a defined thickness to the surface of the sub-mount carrier 30. Several edge-emitting lasers 10 are arranged on the respective surfaces of metallisation layers 31, 31a and 31b. The metallisation layers are also used to provide an electrical contact to the respective edge-emitting lasers 10. On top of each edge-emitting laser 10, contact areas 19 are located, which comprises a bond wire to the corresponding second metallisation layers 31, 31a and 31b. This allows addressing and switching the lasers individually on or off.

In addition, the sub-amount comprises metallisation layer 33, on which a planar light circuit 20b is arranged upon. The planar light circuit 20b comprises a plurality of light guides 22, which are combined to a common line and applied to outlet 28, at the right side of the arrangement. Each light guide extends to inlet 26 on the left front surface of the circuit body of PLC 20b. The inlet 26 is located in z-direction at a distance from a reference level corresponding to the distance (in z-direction) between the facing laser facet 14 and the reference level of the edge-emitting laser facing the inlet 26. As the distance in z-direction between the reference level and the laser facets and inlets are the same, the z-position between the respective laser and the light guide is already defined.

The distance (in y-direction) between the edge-emitting laser and the surface of the PLC facing the corresponding edge-emitting laser is given by spacers arranged on the top surface of the PLC 20b. Hence, only the x-direction of the respective edge-emitting lasers and the light guides 22 of PLC 20b needs to be adjusted. For this purpose, each edge-emitting laser comprises a pair of fiducials 18 on the respective top surface. The fiducials 18 are arranged on both sides of the ridge resonator and as such mark the position of the ridge resonator. Likewise, the PLC comprises three pairs of fiducials 24, which mark the inlet 26 of the respective light guides arranged in between.

During manufacturing of the laser projection arrangement, the fiducials 18 and 24 are located on the same plane. This enables an automated camera to focus on both fiducials 18 and 24, respectively at the same time. Having both fiducials in focus, allows for a simple adjustment in x-direction until both fiducials 18 and 24 are aligned, thus aligning the laser facet directly opposite the inlet 26. This position, in which the fiducials 18 and 24 are aligned, is illustrated in FIG. 8.

Figure 9:
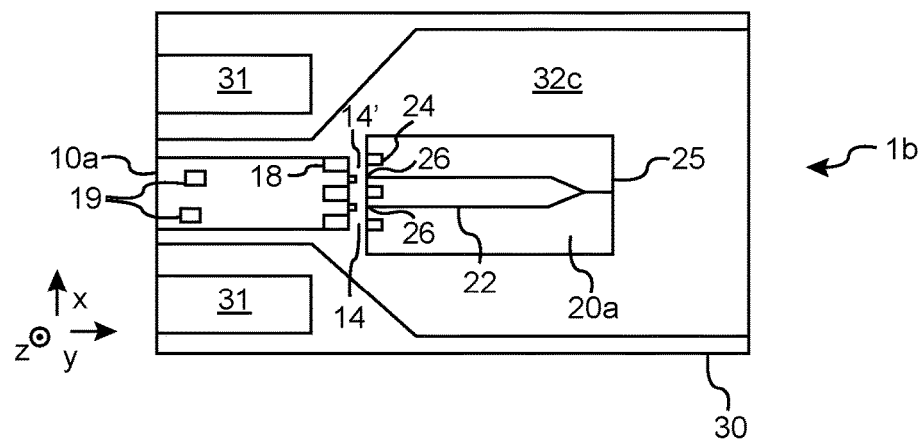
FIG. 9 shows a top view of another exemplary laser arrangement using a laser with multiple laser facets in accordance with some aspects of the present disclosure.

FIG. 9 shows a further example of a laser projection arrangement 1b. In this example, a common metallisation layer 32c is provided comprising a planar and flat surface for both the edge-emitting laser 10 and the PLC 20a. The edge-emitting laser 10a comprises two ridged resonators with two laser facets 14 and 14'. The facets are distanced from each other by about 100 μm. On the top surface of the edge-emitting laser 10a, two contact pads 19 are arranged for contacting respective contact areas 31 on the sub-mount carrier. The contact pads 19 are electrically coupled to one of the ridge resonators to control each resonator elements in the edge-emitting laser 10 separately.

In addition, the top surface also comprises three fiducials 18, located close to the respective laser facets marking their position in x-direction. The edge-emitting laser 10a is arranged on the metallisation layer 32 in accordance with previous aspects of the present disclosure. The laser projection arrangement 1b also comprises a PLC 20a, including two light guides 22 with respective inlet portions 26 at the left front side. The distance between the two inlet portions 26 corresponds to the distance between the two laser facets 14 and 14' of the edge-emitting laser 10a. The two light guides are later combined into a single light guide and provided to a common outlet 25.

Further to this arrangement of PLC 20a, three more fiducials 24 are arranged as markings on the top of the PLC. The position of the fiducials on the laser or the PLC 20a with respect to the position of the respective laser facet or the inlet is known. For arranging PLC 20a correctly towards the laser facets 14 and 14' of edge-emitting laser 10, the design of the PLC 20a is selected such that the distance from the centre of inlet 26 to the top surface of metallisation layer 32c corresponds to the distance between the centre of the laser facets 14 and the top surface of metallisation layer 32. Hence, the distance in z-direction is defined by design of the laser and the PLC.

Adjustment in the y-direction is given by spacers between the edge-emitting laser 10a and the PLC 20a. The adjustment in x-direction is provided by aligning the fiducials 18 on edge-emitting laser 10a and the fiducials 24 on PLC 20a until they face each other. The tolerance for such alignment in x-direction is in the range of 0.2 μm to a few μm.

Figure 10:
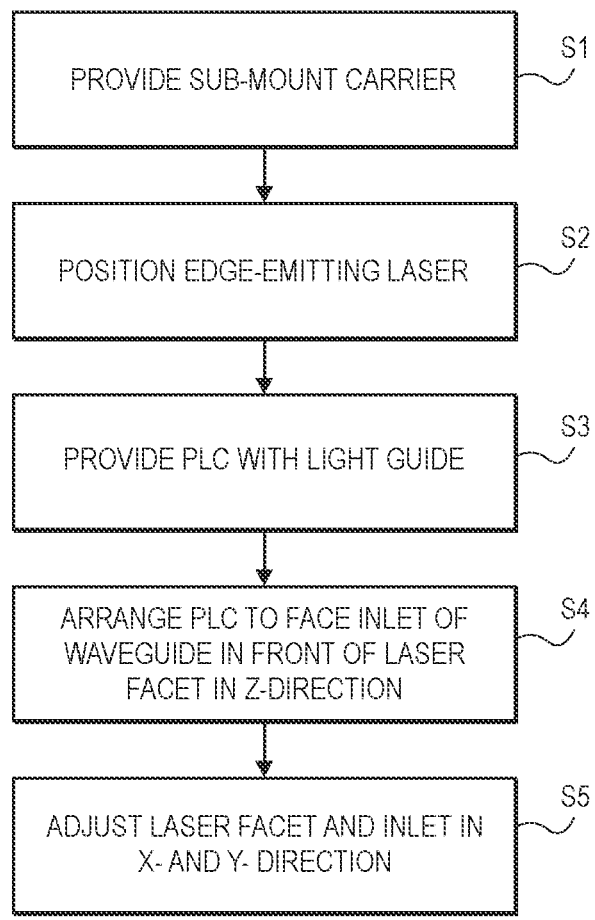
FIG. 10 shows an exemplary method for arranging a laser projection arrangement.

FIG. 10 shows an example of several method steps for arranging a laser projection arrangement in accordance to the proposed principle.

In step S1, a sub-mount carrier with the main surface is provided. The sub-mount carrier is configured to receive at least one edge-emitting laser and at least one planar light circuit. In some examples, the sub-mount carrier can also comprise a planar and flat metallisation layer, on which the respective at least one edge-emitting laser and the at least one planar light circuit may be arranged.

In a next step S2, the at least one edge-emitting laser is positioned onto the sub-mount carrier such that the edge-emitting laser is facing the main surface. For example, the ridge resonator of the at least one edge-emitting laser may face the main surface of the metallisation layer or the main surface of the sub-mount carrier. At least one laser facet of the at least one edge-emitting laser is now located at a predefined and well-known distance from a reference level in z-direction, i.e. the main surface of the metallization layer or sub-mount carrier. As the thickness of the metallization layer is adjustable, the distance is merely a design choice and thus the distance can be adjusted to known elements. For example, one may simply buy a PLC with a defined position of the inlet. One can adjust now the position of the laser facet in z-direction either by design or by providing a respective metallization layer on the sub-mount carrier to compensate for any difference in z-direction.

The planar light circuit with at least one light guide having an inlet is provided in step S3. In some aspects also implemented in step S3, the planar light circuit may also comprise one or more spacer elements arranged on the same surface as the inlet in such way that these spacer elements provide a predefined distance in y-direction when, later arranging the planar light circuit and the at least one edge-emitting laser.

In step S4, the planar light circuit with the at least one light guide facing the main surface is arranged on the sub-mount carrier or the metallisation layer thereof. The arrangement is performed in such way that the inlet of the at least one light guide is positioned at the same distance from the given reference level in z-direction as the laser facet. Thereby, both inlet and laser facet are facing each other. In other words, planar light circuit and edge-emitting laser are arranged and designed in such way that their respective laser facets and inlets are always positioned at the same height or at the same distance with respect to a reference level.

In step S5, an adjustment procedure is performed to adjust both, the laser facet and the inlet in y- and x-direction. Both elements should be positioned as close as possible to each other, but without risking damaging one of it, i.e. due to thermal expansion, bending or other mechanical stress. The distance in y-direction can be defined by spacers. For the adjustment in x-direction, a procedure is necessary. To support this adjustment, markers can be provided, which can be used as reference point for adjusting one or both elements in x-direction until laser facet and inlet are aligned. For this purpose, the position of the markings with respect to the position of the laser facet or the inlet on the respective laser or PLC is known.

Finally, the at least one edge-emitting laser or the planar light circuit is soldered onto the sub-mount. The solder process of at least one of these two elements is usually performed after the adjustment procedure. Alternatively, it is possible to do the adjustment during the soldering procedure. Instead of a solder process, another mechanically fixating method can be used. Further alternative, one may use friction welding of one or more of these two elements onto the sub-mount carrier.

REFERENCE LIST 1, 1a, 1b laser arrangement
10, 10a edge-emitting laser
11 semiconductor body
12 active area, multi-quantum-well
13 semiconductor layer
14 laser facet
14a ridge
15, 15a passivation layer
16 metallisation layer
17, 17a solder layer
18 fiducial
19 contact pad
19a bond wire
20, 20a, 20b planar light circuit
21 circuit body
22, 22a light guide
22b output
23, 23a metallisation layer
24 fiducial
25 outlet
26 inlet
27 spacer
30 sub-mount
31, 31a, 31b metallisation layer
32, 32a, 32b metallisation layer
32c common metallisation layer
33 metallisation layer
D distance

The invention claimed is:

1. A laser projection arrangement, comprising:
a sub-mount carrier with a main surface;
at least one edge-emitting laser arranged on the main surface, whereas the at least one edge-emitting laser is facing the sub-mount carrier and comprises at least one laser facet that is positioned at a predefined distance from the main surface; and
a planar light circuit with at least one light guide having an inlet, wherein the planar light circuit is arranged on the main surface such that the at least one light guide and the inlet is facing the at least one laser facet and is positioned at the predefined distance from the main surface of the sub-mount; and
wherein the at least one edge-emitting laser comprises a ridged resonator, wherein the ridged resonator is surrounded along the sides with a passivation layer and covered with a metallisation, the metallisation facing the sub-mount carrier.

2. The laser projection arrangement according to claim 1, wherein the at least one edge-emitting laser comprises a single mode laser having a facet area in a range of 200 nm$^2$ to 2 μm$^2$.

3. The laser projection arrangement according to claim 1, wherein the planar light circuit comprises a glass carrier, on which the at least one light guide is arranged or in which the at least one light guide is embedded.

4. The laser projection arrangement according to claim 1, wherein a distance between the at least one laser facet and the inlet of the at least one light guide is in the range of 500 nm to 50 μm.

5. The laser projection arrangement according to claim 1, further comprising a spacer located between the at least one edge-emitting laser and the at least one light guide, wherein the spacer is arranged on one of:
a metallisation layer forming the main surface;
the surface of the planar light circuit facing the at least one edge-emitting laser;
the surface of the at least one edge-emitting laser facing the planar light circuit.

6. The laser projection arrangement according to claim 1, wherein the main surface comprises a first metallized contact strip on which at least the at least one edge-emitting laser is adhered on thereby defining the distance from the main surface of the sub-mount carrier.

7. The laser projection arrangement according to claim 6, wherein the at least one edge-emitting laser comprises a first surface part facing the sub-mount, which is directly in contact with the metallized contact strip and a second surface part facing the sub-mount carrier, which is adhered to, in particular soldered to the sub-mount carrier.

8. The laser projection arrangement according to claim 6, wherein the first metallized contact strip is configured as a common metallized contact strip, on which the planar light circuit is arranged on.

9. The laser projection arrangement according to claim 1, further comprising at least one fiducial arranged on the at least one edge-emitting laser and at least one fiducial arranged on the planar light circuit, the fiducials configured for adjusting the inlet of the at least one light guide and the at least one laser facet; wherein optionally, the at least two fiducials are substantially arranged in the same plane, said plane parallel to the main surface of the sub-mount.

10. The laser projection arrangement according to claim 1, wherein—the at least one edge-emitting laser comprises two ridged resonators substantially parallel to each other and spaced apart by a distance in the range of 10 µm to 100 µm, in particular in the range of 50 µm; and wherein
the planar light circuit comprises two light guides, the inlets of those spaced apart by the same distance.

11. The laser projection arrangement according to claim 1, wherein the material of the at least one light guide comprises $Si_3N_4$ and the at least one light guide is covered from at least one side by a metallisation layer.

12. The laser projection arrangement according to claim 1, comprising:
at least three edge-emitting laser configured to emit light of different wavelengths, wherein the at least three edge-emitting lasers are arranged on the sub-mount carrier and each of the three edge-emitting laser comprises at least one laser facet;
wherein the planar light circuit comprises at least three light guides having an inlet, wherein a respective inlet is facing one of the at least one laser facets;
wherein the planar light circuit is configured to combine light of the at least three light guides and provide the combined light at a common outlet.

13. The laser projection arrangement according to claim 1, wherein the sub-mount comprises a common metallisation layer, on which the at least three edge-emitting laser are attached on thereby defining the distance from the main surface of the sub-mount.

14. The laser projection arrangement according to claim 6, further comprising a second contact strip on the sub-mount configured to provide an electrical contact to one of the at least one edge-emitting laser, in particular to provide an area for bond contact to connect to the at least one edge-emitting laser.

15. A method for arranging a laser projection arrangement comprising:
providing a sub-mount carrier with a main surface configured to receive at least one edge-emitting laser and at least one planar light circuit;
arranging the at least one edge-emitting laser onto the sub-mount carrier such that the at least one edge-emitting laser is facing the main surface and at least one laser facet of the at least one edge-emitting laser is positioned at a pre-defined distance from the main surface;
providing a planar light circuit with at least one light guide having an inlet; and
arranging a planar light circuit with the at least one light guide facing the main surface such that the inlet of the at least one light guide is positioned at the pre-defined distance from the main surface and facing the at least one edge-emitting laser; and
wherein the at least one edge-emitting laser comprises a ridged resonator, wherein the ridged resonator is surrounded along the sides with a passivation layer and covered with a metallisation, the metallisation facing the sub-mount carrier.

16. The method according to claim 15, wherein the step of arranging the at least one edge-emitting laser and the planar light circuit comprises one of:
soldering the at least one edge-emitting laser and/or the planar light circuit onto the sub-mount; and
friction welding the at least one edge-emitting laser and/or the planar light circuit onto the sub-mount.

17. The method according to claim 15, further comprising:
adjusting a positon of the at least one edge-emitting laser and the planar light circuit, such that laser facets and inlet are aligned in a direction parallel to the surface of the laser facet and inlet, respectively.

18. The method according to claim 15, wherein providing a sub-mount comprises:
depositing a structured planarized metallisation layer onto the sub-mount.

* * * * *